United States Patent
Hsu et al.

(10) Patent No.: US 8,564,178 B2
(45) Date of Patent: Oct. 22, 2013

(54) MICRO ELECTRIC GENERATOR, METHOD OF PROVIDING THE SAME, AND ELECTRIC GENERATING DEVICE

(75) Inventors: Wen-Kuang Hsu, Hsinchu (TW); Hsin-Fu Kuo, Hsinchu (TW); Chia-Jung Hu, Hsinchu (TW); Yu-Hsien Lin, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 311 days.

(21) Appl. No.: 12/907,437

(22) Filed: Oct. 19, 2010

(65) Prior Publication Data

US 2012/0013223 A1 Jan. 19, 2012

(30) Foreign Application Priority Data

Jul. 14, 2010 (TW) .............................. 99123096 A

(51) Int. Cl.
*H01L 41/113* (2006.01)
(52) U.S. Cl.
CPC ........... *H01L 41/1134* (2013.01); *Y10S 310/80* (2013.01)
USPC ........................................... 310/339; 310/800
(58) Field of Classification Search
CPC ....................... H01L 41/1134; H01L 41/316
USPC ................................................... 310/339, 800
See application file for complete search history.

(56) References Cited

U.S. PATENT DOCUMENTS

| 3,976,898 A | 8/1976 | Newson |
| 2009/0179523 A1* | 7/2009 | Wang et al. .................. 310/338 |
| 2010/0141095 A1* | 6/2010 | Park .............................. 310/339 |

FOREIGN PATENT DOCUMENTS

CN 101575082 A 11/2009

* cited by examiner

*Primary Examiner* — Derek Rosenau
(74) *Attorney, Agent, or Firm* — Muncy, Geisslar, Olds & Lowe, PLLC

(57) ABSTRACT

A micro electric generator is disclosed, which comprises: at least one electrically conductive fiber, and at least one piezoelectric ceramic layer covering on the surface of that at least one electrically conductive fiber. When a mechanical force is applied to deform the electrically conductive fiber covered with the piezoelectric ceramic layer, electric energy is generated. Also, a method of fabricating the said micro electric generator and an electric generating device are disclosed.

9 Claims, 4 Drawing Sheets

MICRO ELECTRIC GENERATOR, METHOD OF PROVIDING THE SAME, AND ELECTRIC GENERATING DEVICE

BACKGROUND OF THE INVENTION

1. Field of the Invention

The present invention relates to a micro electric generator based on piezoelectric material, a method of providing the same, and an electric generating device.

2. Description of Related Art

Piezoelectric effect is the ability of some materials to generate an electric field or electric potential in response to applied mechanical stress. Piezoelectric materials can be applied into numerous uses such as bio-medical usages, electrical vehicles, wind power plants, hydroelectric power plants, wireless sensors, personal electronics, micro-electro-mechanical systems (MEMS), nano-electro-mechanical systems (NEMS), etc. Piezoelectric materials include barium titanate ($BaTiO_3$), lead zirconate-titanate (PZT), quartz, tourmaline, Rochelle salts, tantalates, niobates, aluminum nitride (AlN), gallium nitride (GaN), and zinc oxide (ZnO), etc.

Based on such piezoelectric materials, a micro electric generator is enabled to convert mechanical energy into electrical energy.

Generally, a conventional micro electric generator may be in a form of stacked-layers in which a piezoelectric layer is sandwiched between two flat electrodes.

U.S. Pat. No. 3,976,898, for example, disclosed a micro electric generator comprising a three-layered [electrode/piezoelectric element/electrode] structure which can convert mechanical stress into electric energy. In CN101575082A, a micro wind turbine generator based on wind-induced vibration mechanism and piezoelectric effect is disclosed, which has a multi-layered structure comprising a piezoelectric layer and metal electrodes.

Reference with FIG. 1, a conventional micro electric generator 10 is shown, which comprises electrode layers 11 and a piezoelectric layer 12 interposed between the electrode layers 11. While a force 13 is applied to the surface of the electrode layer 11, the piezoelectric layer 12 sandwiched between two electrode layers 11 converts the force 13 into electrical energy.

However, the generated current density of such micro electric generator with multi-layered structure is usually unsatisfactory, and the manufacturing cost is high. In this regard, it is desirable to provide an improved technique toward micro electric generator to achieve superior current density and lower the manufacturing cost.

SUMMARY OF THE INVENTION

The present invention provides a novel structure of micro electric generator. Utilizing the piezoelectric effect, the micro electric generator is able to convert mechanical stress into electrical energy.

The micro electric generator of the present invention comprises at least one electrically conductive fiber and at least one piezoelectric ceramic layer covering the surface of the at least one electrically conductive fiber. When a mechanical force is applied to deform the electrically conductive fiber covered with the piezoelectric ceramic layer, electrical energy is generated.

As the micro electric generator of the present invention can be made from cheap conductive fibers, the manufacturing cost can be reduced. Also, since the structure and fabricating method of the micro electric generator of the present invention are both simple, it is suitable for large quantity manufacture. Current testing result proves that an excellent piezoelectric characteristic is obtained (i.e. a high current density can be generated) by the micro electric generator of the present invention. The same performance cannot be realized by a conventional micro electric generator.

Besides, since the micro electric generator of the present invention is in a line shape, it can be applied into numerous applications. For example, the micro electric generator of the present invention can be woven into clothes or other fiber-based items, whereas the conventional multi-layered-structured electric generator has a more limited application scope.

According to the micro electric generator of the present invention, the electrically conductive fiber is preferably carbon fiber, conductive polyester fiber, or metal fiber such as stainless fiber, copper fiber, silver fiber, etc, more preferably carbon fiber. Carbon fibers are materials that can be easily obtained and have advantage of being more flexible and tough than metal fibers. Also, the conductivity of carbon fiber is good enough to carry a high current density.

According to the micro electric generator of the present invention, the quantity of the electrically conductive fiber can be one or above, and each of the electrically conductive fibers is covered with the piezoelectric ceramic layer. In the micro electric generator of the present invention, the more the quantity of the electrically conductive fibers, the greater the generated current is.

According to the micro electric generator of the present invention, the diameter of the electrically conductive fiber is preferably 0.5 µm to 100 µm.

According to the micro electric generator of the present invention, the piezoelectric ceramic layer is preferably made of one selected from a group consisting of: barium titanate ($BaTiO_3$), lead zirconate titanate (PZT), quartz, tourmaline, Rochelle salts, tantalates, niobates, aluminum nitride (AlN), gallium nitride (GaN), and zinc oxide (ZnO); and more preferably is made of zinc oxide (ZnO), which is a non-toxic, biocompatible, and degradable materials.

According to the micro electric generator of the present invention, the thickness of the piezoelectric ceramic layer is preferably 0.5 Å to 1500 Å.

The present invention also provides a method of fabricating a micro electric generator, which comprises steps: (A) providing at least one electrically conductive fiber, and (B) forming a piezoelectric ceramic layer covering on the surface of the at least one electrically conductive fiber. When a mechanical force is applied to deform the electrically conductive fiber covered with the piezoelectric ceramic layer, electrical energy is generated.

The method of fabricating the micro electric generator of the present invention is simple, quick, and low-cost due to the cheap raw material such as carbon fibers; therefore it is suitable for large quantity manufacture. Current testing result proves that an excellent piezoelectric characteristic is obtained (i.e. a high current density can be generated) in the micro electric generator fabricated by the method of the present invention. The same performance cannot be realized by a conventional micro electric generator.

Besides, since the micro electric generator made by the method of the present invention is in a line shape, it can be applied into a numerous applications. For example, the micro electric generator made by the method of the present invention can be woven into clothes or other fiber-based items, whereas the conventional multi-layered-structured electric generator has a more limited application scope.

According to the method of fabricating a micro electric generator of the present invention, the electrically conductive fiber is preferably carbon fiber, conductive polyester fiber, or metal fiber such as stainless fiber, copper fiber, silver fiber, etc; more preferably is carbon fiber. Carbon fibers are materials that can be easily obtained and have advantage of being more flexible and tough than metal fibers. Also, the conductivity of carbon fiber is good enough to carry a high current density.

According to the method of fabricating a micro electric generator of the present invention, the diameter of the electrically conductive fiber is preferably 0.5 µm to 100 µm.

According to the method of fabricating a micro electric generator of the present invention, the piezoelectric ceramic layer of step (B) is preferably formed by covering the surface of the at least one electrically conductive fiber by the atomic layer deposition method, sol gel method, or chemical vapor deposition (CVD) method; and is more preferably formed by the atomic layer deposition method.

According to the method of fabricating a micro electric generator of the present invention, the material of the piezoelectric ceramic layer is preferably one selected from a group consisting of: barium titanate ($BaTiO_3$), lead zirconate titanate (PZT), quartz, tourmaline, Rochelle salts, tantalates, niobates, aluminium nitride (AlN), gallium nitride (GaN), and zinc oxide (ZnO); and more preferably is made of zinc oxide (ZnO), which is a non-toxic, biocompatible, and degradable materials.

The present invention also provides an electric power generating device, which comprises: at least one electrically conductive fiber; at least one piezoelectric ceramic layer covering on the surface of the at least one electrically conductive fiber; at least a pair of electrodes connecting with the ends of the electrically conductive fiber covered with the piezoelectric ceramic layer; and a substrate for carrying and fixing the electrically conductive fiber covered with the piezoelectric ceramic layer. When a mechanical force is applied to deform the electric power generating device, electrical energy is generated.

As the electric power generating device of the present invention can be made from cheap conductive fibers, the manufacturing cost can be low. Also, since the structure and fabricating method of the electric power generating device of the present invention are both simple, it is suitable for large quantity manufacture. Current testing result proves that an excellent piezoelectric characteristic is obtained (i.e. a high current density can be generated) in the electric power generating device of the present invention. The same performance cannot be realized by a conventional micro electric generator.

According to the electric power generating device of the present invention, the piezoelectric ceramic layer is preferably made of one selected from a group consisting of: barium titanate ($BaTiO_3$), lead zirconate-titanate (PZT), quartz, tourmaline, Rochelle salts, tantalates, niobates, aluminium nitride (AlN), gallium nitride (GaN), and zinc oxide (ZnO); and more preferably is made of zinc oxide (ZnO), which is a non-toxic, biocompatible, and degradable materials.

According to the electric power generating device of the present invention, the electrically conductive fiber is preferably carbon fiber, conductive polyester fiber, or metal fiber such as stainless fiber, copper fiber, silver fiber, etc; more preferably carbon fiber. Carbon fibers are materials that can be easily obtained and have advantage of being more flexible and tough than metal fibers. Also, the conductivity of carbon fiber is good enough to carry a high current density.

According to the electric power generating device of the present invention, the diameter of the electrically conductive fiber is preferably 0.5 µm to 100 µm.

According to the electric power generating device of the present invention, the thickness of the piezoelectric ceramic layer is preferably 0.5 Å to 1500 Å.

Other objects, advantages, and novel features of the invention will become more apparent from the following detailed description when taken in conjunction with the accompanying drawings.

DETAILED DESCRIPTION OF THE PREFERRED EMBODIMENT

EXAMPLE 1

Figure 1:
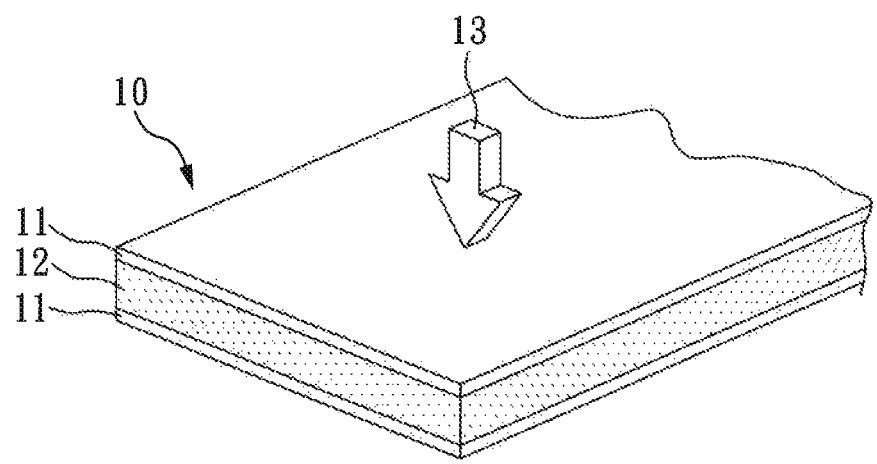
FIG. 1 is a schematic view of a conventional micro electric generator.
Figure 2A:
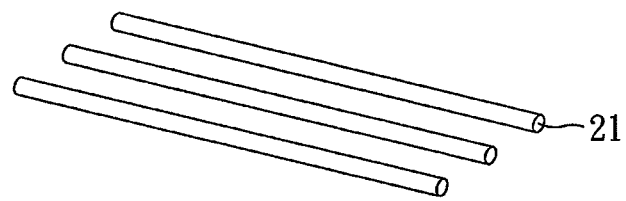
FIGS. 2A-2E show the schematic process flow chart of fabricating a micro electric generator and an electric power generating device of the example 1.
Figure 2B:
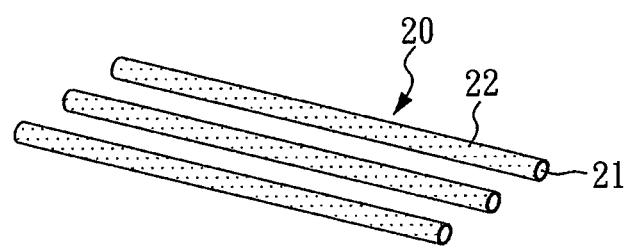
Figure 2C:
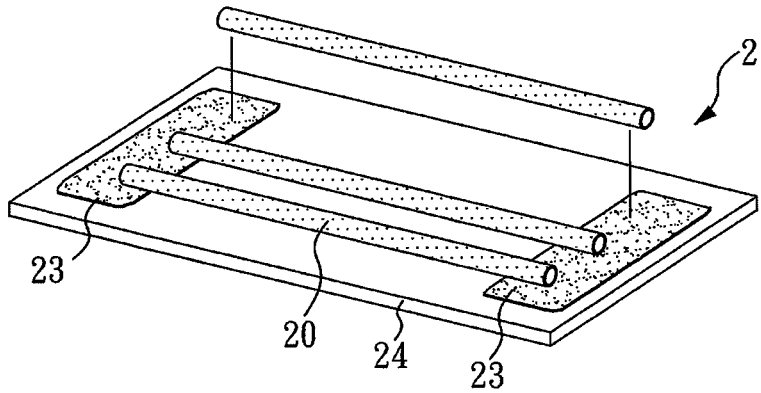

With reference to FIGS. 2A to 2C, first, (A) a plurality of carbon fiber 21 is provided as shown in FIG. 2A. Then, (B) a zinc oxide (ZnO) layer 22 with thickness of 500 Å is deposited on the carbon fiber 21 using an atomic layer deposition method to obtain micro electric generators 20 of the present example. Reference with FIG. 2B, the micro electric generator 20 of the present invention comprises a carbon fiber 21 (i.e. the electrically conductive fiber) covered with a zinc oxide (ZnO) layer 22 (i.e. the piezoelectric ceramic layer).

Subsequently, two metal layers 23 are formed to fix the micro electric generator 20 on the flexible substrate 24. The metal layers 23 are formed at the ends of the micro electric generator 20 by spreading silver paste or other electrically conductive glues and also function as electrodes.

Figure 2D:
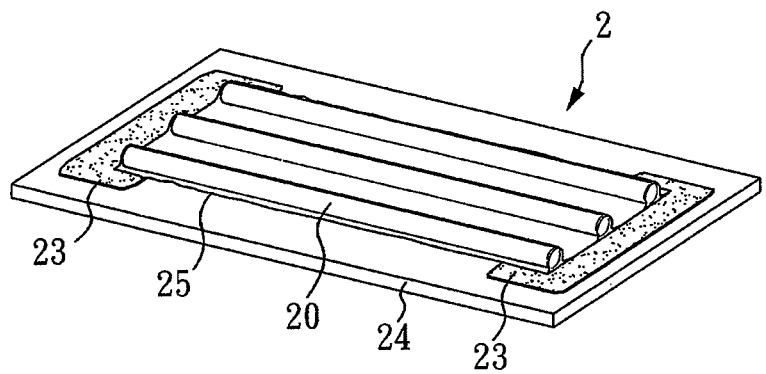

Finally, as shown in FIG. 2D, resin paste 25 for protecting the micro electric generator 20 is spread on the micro electric generator 20, and is then dried at room temperature. The dried resin paste 25 covering the micro electric generator 20 may enable the micro electric generator 20 to avoid dust, moisture, etc. In order to sufficiently protect those micro electric generators 20, care must be taken to ensure that the resin paste 25 covers the whole micro electric generator 20 and part of the metal layers 23 (i.e. the electrodes), but does not cover completely the whole metal layers 23, otherwise an electrical connection from an outer electrical element may not be constructed.

Figure 2E:
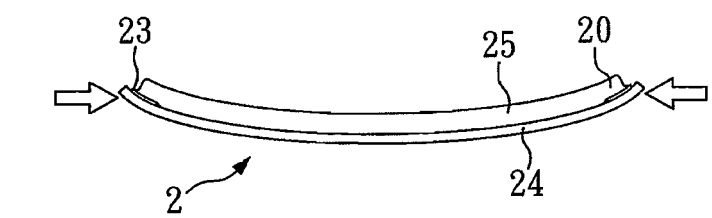

Hence, an electrical power generating device 2 of the present example is obtained and is schematically shown in FIG. 2C, in which the electrical power generating device 2 of the present example comprises plurality of carbon fibers 21 (i.e. the electrically conductive fiber), zinc oxide layers 22 (i.e. the piezoelectric ceramic layers) covering the surface of the carbon fibers 21, metal layers 23 (i.e. the electrodes) connecting with the ends of the micro electric generators 20 (the carbon fiber 21 covered with zinc oxide (ZnO) layer 22), and a substrate 24 for carrying the carbon fiber 21 covered with the zinc oxide (ZnO) layer 22. Reference with FIG. 2E, when mechanical force at the left and right hand sides of the electric power generating device 2 in the FIG. 2E is applied to deform the electric power generating device 2 of the present invention, electric energy is generated, which means, the electric power generating device 2 of the present invention can convert mechanical stress (i.e. mechanical energy) into electric power.

EXAMPLE 2

The same method of fabricating an electric power generating device of example 1 is used here to provide an electric power generating device of the present example, except that in the step (B) a sol-gel method is used to replace the atomic layer deposition method, and conductive polyester fibers are used to substitute the carbon fibers in the example 1.

TESTING EXAMPLE 1

Figure 3:
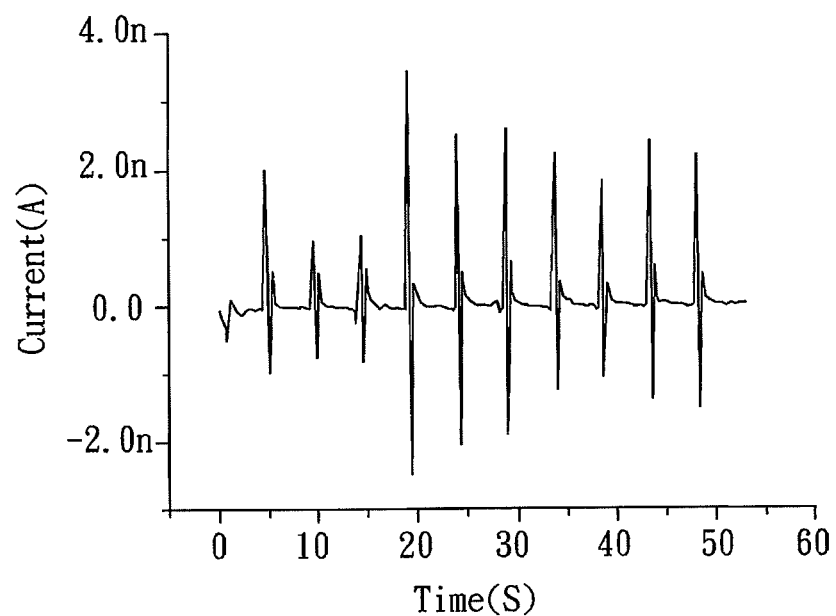
FIG. 3 is the testing result (the induced current) of the electric power generating device of the example 1.

An electric power-generating device 2 of the example 1 is taken for the current test, and the test result is shown in FIG. 3. The diameter of the carbon fiber in the electric power generating device 2 used herein is about $5 \times 10^{-6}$ m. As can be seen from the testing result, the output current is about $2.13 \times 10^{-9}$ A, so the calculated current density is about $1.08 \times 10^{7}$ nA/cm$^2$, which is several orders greater than that obtained from a zinc oxide nanowire based electric generators.

Herein, it should be noticed that the energy source for power generation (the mechanical energy) is supplied manually, and therefore the output current for each time may differ slightly. If the mechanical energy is steadily supplied, e.g. by a stepper motor, a regular current for each time can be obtained.

TESTING EXAMPLE 2

Figure 4:
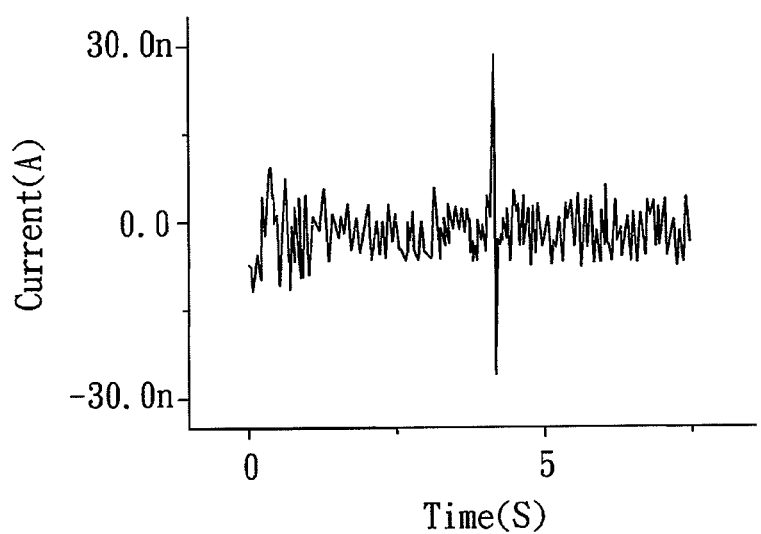
FIG. 4 is the testing result (the induced current) of the electric power generating device of the example 2.

According to the present invention, plural micro electric generators 20 can be electrically connected in parallel to enlarge the output current. In the present testing example, an electric power generating device (not shown) comprising more micro electric generators than that of the example 1 is taken into current test, and the obtained current is about $30 \times 10^{-9}$ A, as shown in FIG. 4. While a real signal of 30 nA appears at the fourth second, indicated in FIG. 4, it should be understood that other signals with much lower amplitude are background signals (noise). The different noise level of electric power generating devices used in the testing examples 1 and 2 originates in the different electrical characteristics of these two electric power generating devices (i.e. electric resistance, electric capacitor, etc.)

COMPARATIVE EXAMPLE

Figure 5:
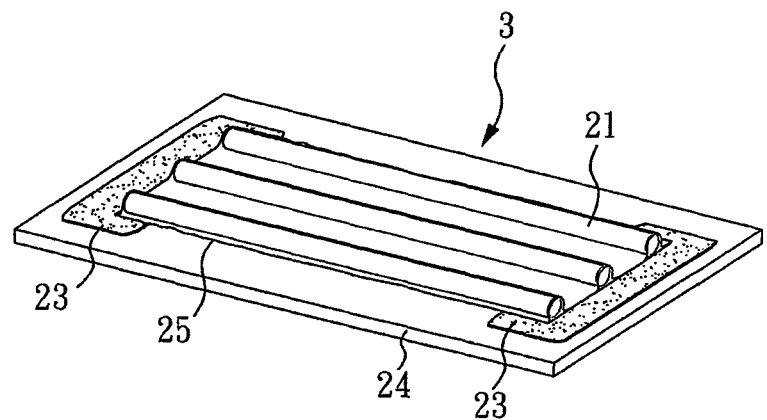
FIG. 5 is a schematic view of a device of the comparative example.

As shown in FIG. 5, plural carbon fibers 21 and two metal layers 23 are fixed on a flexible substrate 24 to provide a device 3. In the present comparative example, those carbon fibers 21 do not have piezoelectric ceramic layer coated thereon.

Figure 6:
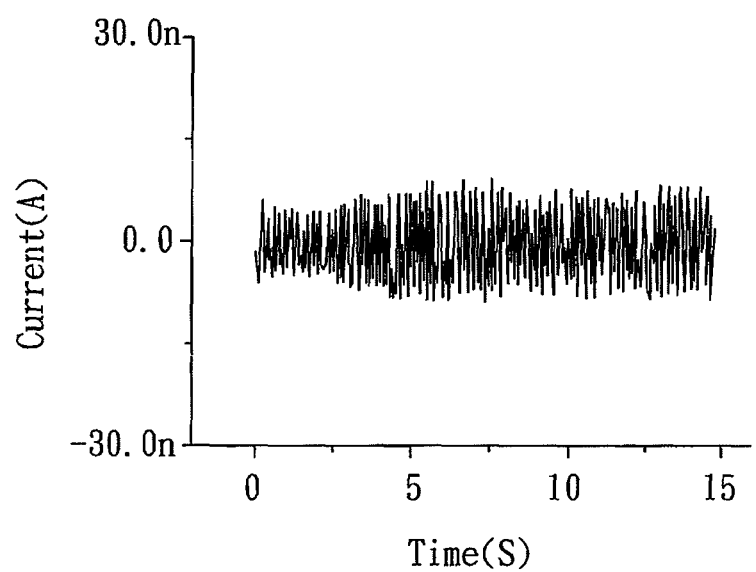
FIG. 6 is the testing result (the induced current) of the device of the comparative example.

The device 3 is then taken to current test and the result is shown in FIG. 6. It can be seen that no piezoelectric response is obtained, only background signals appear in the test result, whereas the current testing results of the testing examples 1 and 2 as shown in FIGS. 3 and 4 respectively prove the excellent piezoelectric characteristic of the electric power generating device of the present invention. As comparison between the results shown in FIGS. 3, 4, and 6, it is proved that the current generated from the electric power generating device of the present invention (FIGS. 3 and 4) is caused by the piezoelectric material (i.e. the piezoelectric ceramic layer) coated on the conductive fibers. Compared with FIG. 6, it is proved that the signal at the fourth second in FIG. 4 is a real signal rather than an invalid noise signal.

As mentioned above, since the micro electric generator and the electric power generating device of the present invention can be made from cheap conductive fibers, the manufacturing cost can be low. Also, the method of fabricating the micro electric generator of the present invention is simple, and large quantities can be easily manufactured. Current testing result proves that an excellent piezoelectric characteristic is obtained (i.e. a high current density can be generated) in the micro electric generator and/or the electric power generating device of the present invention. The same performance cannot be realized by a conventional micro electric generator. Besides, since the micro electric generator made by the method of the present invention is in a line shape, it can be applied into a numerous applications. For example, the micro electric generator made by the method of the present invention can be woven into clothes or other fiber-based items, whereas the conventional multi-layered-structured electric generator has a more limited application scope.

Although the present invention has been explained in relation to its preferred embodiment, it is to be understood that many other possible modifications and variations can be made without departing from the spirit and scope of the invention as hereinafter claimed.

What is claimed is:

1. A micro electric generator, which comprises:
   at least one electrically conductive fiber; and
   at least one piezoelectric ceramic layer covering the surface of the at least one electrically conductive fiber, the diameter of the electrically conductive fiber being 0.5 µm to 100 µm,
   wherein when a mechanical force is applied to deform the electrically conductive fiber covered with the piezoelectric ceramic layer, electrical energy is generated.

2. The micro electric generator as claimed in claim 1, wherein the electrically conductive fiber is carbon fiber.

3. The micro electric generator as claimed in claim 1, wherein the quantity of the electrically conductive fiber is one or above, and each of the electrically conductive fibers is covered with the piezoelectric ceramic layer.

4. The micro electric generator as claimed in claim 1, wherein the piezoelectric ceramic layer is made of zinc oxide (ZnO).

5. The micro electric generator as claimed in claim 1, wherein the thickness of the piezoelectric ceramic layer is 0.5Å to 1500Å.

6. An electric power generating device, which comprises:
   at least one electrically conductive fiber;
   at least one piezoelectric ceramic layer covering the surface of the at least one electrically conductive fiber;
   at least a pair of electrodes connecting with the ends of the electrically conductive fiber covered with the piezoelectric ceramic layer; and
   a substrate for carrying and fixing the electrically conductive fiber covered with the piezoelectric ceramic layer, the electrically conductive fiber lying on the substrate,
   wherein when a mechanical force is applied to deform the electric power generating device, electrical energy is generated,
   wherein the diameter of the electrically conductive fiber is 0.5 µm to 100 µm.

7. The electric power generating device as claimed in claim 6, wherein the piezoelectric ceramic layer is made of zinc oxide (ZnO).

8. The electric power generating device as claimed in claim 6, wherein the electrically conductive fiber is carbon fiber.

9. The electric power generating device as claimed in claim 6, wherein the thickness of the piezoelectric ceramic layer is 0.5Å to 1500Å.

* * * * *